(12) United States Patent
Garofalo et al.

(10) Patent No.: US 7,965,561 B2
(45) Date of Patent: Jun. 21, 2011

(54) ROW SELECTOR OCCUPYING A REDUCED DEVICE AREA FOR SEMICONDUCTOR MEMORY DEVICES

(75) Inventors: Pierguido Garofalo, San Donato Milanese (IT); Efrem Bolandrina, Fiorano al Serio (IT); Claudio Nava, Cornate d'Adda (IT)

(73) Assignee: Micron Technology, Inc., Boise, ID (US)

( * ) Notice: Subject to any disclaimer, the term of this patent is extended or adjusted under 35 U.S.C. 154(b) by 489 days.

(21) Appl. No.: 11/672,857

(22) Filed: Feb. 8, 2007

(65) Prior Publication Data

US 2007/0195605 A1    Aug. 23, 2007

(30) Foreign Application Priority Data

Feb. 9, 2006    (IT) .............................. MI2006A0220

(51) Int. Cl.
*G11C 16/08* (2006.01)

(52) U.S. Cl. .......... 365/185.23; 365/185.11; 365/185.33

(58) Field of Classification Search ............. 365/185.11, 365/185.23, 185.33
See application file for complete search history.

(56) References Cited

U.S. PATENT DOCUMENTS

| | | | | |
|---|---|---|---|---|
| 6,115,289 A * | 9/2000 | Sin | ........................... | 365/185.23 |
| 6,434,052 B1 * | 8/2002 | Son et al. | .................. | 365/185.23 |
| 7,468,916 B2 * | 12/2008 | Chen | ........................ | 365/185.23 |
| 2009/0213669 A1 * | 8/2009 | Lee | ........................... | 365/189.11 |

* cited by examiner

*Primary Examiner* — Andrew Q Tran
(74) *Attorney, Agent, or Firm* — Blakely, Sokoloff, Taylor & Zafman LLP (57) ABSTRACT

A memory device having a plurality of memory cells grouped in at least two memory sectors is disclosed. A first decoding circuit operable to receive address codes of the plurality of memory cells and to generate a plurality of decoding and selecting signals in response to the address codes. A plurality of second decoding circuits are coupled to the first decoding circuit and operable to generate driving signals for the memory cell address signal lines based at least in part on the plurality of decoding and selecting signals. A voltage shifting circuit is operable to generate a shift in the voltage of the plurality of decoding and selecting signals for generating a plurality of shifted voltage decoding and selecting signals and to provide the shifted decoding and selecting signals to the plurality of second decoding signals for generating the drive signals.

20 Claims, 4 Drawing Sheets

ROW SELECTOR OCCUPYING A REDUCED DEVICE AREA FOR SEMICONDUCTOR MEMORY DEVICES

BACKGROUND OF THE INVENTION

1. Field of the Invention

The present invention relates to the field of semiconductor memories. More specifically, the present invention relates to managing data addressing in a semiconductor memory.

2. Description of the Related Art

In semiconductor memory devices, and in particular non-volatile electrically programmable memories, "flash" memories find various applications. The cells of a flash memory typically consist of floating gate MOS transistors, and they are adapted to store a logic value defined by the threshold voltage of the MOS transistors, which depends on the electric charge stored in the floating gate. The cells of a flash memory are individually programmable (i.e., they can be "written"), while erasing occurs simultaneously for a great number of cells; typically, the cells of a flash memory are organized in memory sectors, each of which is individually erasable.

For example, in bi-level flash memories, where each cell is adapted to store one bit of information, in an erased condition the generic cell has a low threshold voltage (the logic value 1 is typically associated therewith); the cell is programmed by the injection of electrons into its floating gate; in this condition the cell has a high threshold voltage (the logic value 0 is typically associated therewith). In multilevel flash memories, each cell is adapted to store more than one bit of information, and it can be programmed in a selected one among a plurality of different states, which correspond to respective threshold voltage values.

For retrieving or storing data, the memories comprise a system for decoding address codes (in the following, for the sake of brevity, addresses) and for selecting corresponding memory locations. In particular, the memory cells are typically arranged according to a plurality of rows and a plurality of columns so as to form a so-called matrix, and the decoding and selecting system comprises a row selector, adapted to decode row addresses and to select one or more matrix rows, and a column selector adapted to decode column addresses and to select one or more columns.

Typically, the flash memories implement a decoding and selecting system suitable to apply positive voltages to the matrix rows during programming operations, and negative voltages during erasing operations. In particular, for programming and erasing, the decoding system has to be adapted to manage voltages (in absolute value) quite higher (for example, for the erasing operation voltages of the order of −9 V can be needed, while for the programming operation 12 V may have to be supplied) than the supply voltages of the device (typically, 1.8 V to 3.3 V).

In single-supply voltage devices, the voltages needed to perform programming and erasing operations are generated inside the memory, starting from the supply voltage, by suitable circuits. Alternatively, such voltages can be provided to the device from the outside, through suitable terminals.

The row selector of a flash memory typically comprises, for each sector, low-voltage pre-decoding and decoding circuits (i.e., operating at voltages of the order of the supply voltage), and level shifters for shifting the signals necessary for the selection of the rows in the programming and erasing operations to the required voltages; for example, for the programming operation the level shifters have to shift the row selection signals to a high voltage.

The row selector of a flash memory generally occupies a wide area of the integrated circuit chip.

In particular, a wide portion of the area of the row selector is occupied by the level shifters, which, for their structure, require the use of relatively large transistors for each sector. The problem becomes greater as the number of sectors present in the memory increases.

This contrasts the increasing request for optimizing the ratio between area of the device and data storage capability.

BRIEF SUMMARY OF THE INVENTION

One embodiment of the present invention proposes a solution that is based on the idea of modifying the structure of the memory cell selector inside the memory of, for example, the matrix rows, in order to reduce the area occupied by the selector itself and, accordingly, the overall size of the memory device.

In particular, an embodiment of the present invention proposes a memory device including: a plurality of memory cells, said memory cells being grouped in at least two memory sectors, a respective memory cell address signal line being associated with each alignment; a first decoding circuit adapted to receive an address code of the memory cells and, in response thereto, to assert a plurality of decoding and selecting signals common to said at least two memory sectors; associated with each one of said at least two memory sectors, a respective second decoding circuit operatively coupled to the first decoding circuit and adapted to generate driving signals of said address lines depending on said decoding and selecting signals. The device further comprises voltage boosting blocks adapted to receive said common decoding and selecting signals and to shift them in voltage to a shifted voltage level for generating respective shifted decoding and selecting signals common to the at least two memory sectors, and to provide them to the second decoding circuits for the generation of the driving signals.

Another embodiment of the present invention provides a corresponding method of operation of a memory device.

BRIEF DESCRIPTION OF THE SEVERAL VIEWS OF THE DRAWINGS

The elements that characterize the present invention are indicated in the appended claims. Moreover, the invention, as well as further features and the advantages thereof, will be better understood with reference to the following detailed description, provided merely by way of non-limiting examples, to be read in conjunction with the attached figures. In particular:

DETAILED DESCRIPTION OF THE INVENTION

Figure 1:
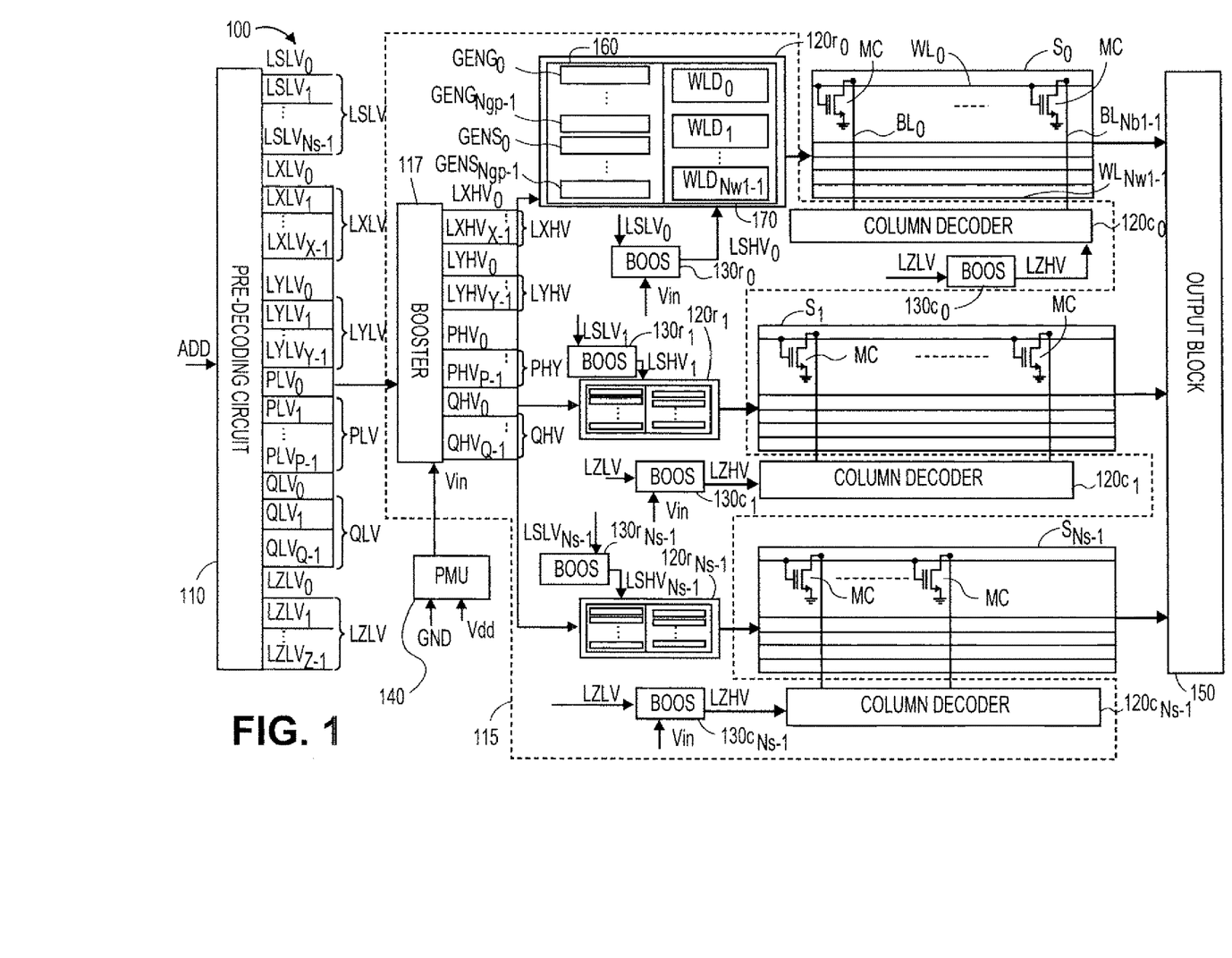
FIG. 1 shows a schematic block diagram of a memory device according to an embodiment of the present invention, referencing blocks of interest in the understanding of the invention.

With reference to FIG. 1, a memory device 100 is represented in a simplified way, in terms of the circuit blocks of interest in the understanding of the embodiment of the invention described herein. In the embodiment described herein, the memory device 100 is a non-volatile memory device, in particular of the electrically programmable and erasable type and, even more particularly, a flash memory device, which comprises a plurality of flash memory cells MC. The flash memory cells MC are grouped in a plurality of memory sectors $S_0, \ldots, S_{Ns-1}$ each one individually erasable. For example, 32 sectors of flash memory cells MC can be provided.

Each memory sector $S_0, \ldots, S_{Ns-1}$ comprises a bi-dimensional arrangement of flash memory cells MC, arranged in memory cell rows and memory cell columns (hereinafter referred to as rows and columns for short).

In particular, the memory cells of a same column are connected to a bit line, while the cells of a same row are connected to a word line. In detail, the generic memory sector comprises a plurality of word lines $WL_0, \ldots, WL_{Nw1-1}$ and a plurality of bit lines $BL_0, \ldots, BL_{Nb1-1}$. In the memory device 100, a power-supply managing unit 140 and an output block 150 are also provided. The power-supply managing unit 140 provides the voltages (indicated in general herein as Vin) used for managing the various operations on the memory device 100, for example a voltage of about 12 V for the programming operations of the cells, a voltage of about −9 V for the erasing operations of the sectors; the voltages Vin are generated (for example, by charge pumps) starting from a supply voltage Vdd provided from the outside (typically, a voltage that can assume values in the range from about 1.8 V to about 3.3 V). The output block 150 comprises the circuitry (such as, for example, the sense amplifiers and the input/output data interface—"buffer"—circuits) necessary for the retrieval of the data stored in the matrix of flash memory cells MC and their outputting from the memory.

For the selection of the memory cells MC, the memory device 100 is adapted to receive, through addressing signals ADD, address codes of the cells.

In particular, the memory device 100 provides a pre-decoding circuit 110 of the addressing signals ADD, a voltage booster block 117 included in a row and column decoding and selection circuit 115; the row and column decoding and selection circuit 115 comprises a plurality of row decoder and selector blocks $120r_0, \ldots, 120r_{Ns-1}$ and a plurality of column decoder and selector blocks $120c_0, \ldots, 120c_{Ns-1}$. In particular, the generic row decoder and selector block and the generic column decoder and selector block interface with the corresponding sector.

Furthermore, the memory device 100 provides a sector voltage booster block $130r_0, \ldots, 130r_{Ns-1}$ and a column voltage booster block $130c_0, \ldots, 130c_{Ns-1}$ for each row decoder and selector $120r_0, \ldots, 120r_{Ns-1}$ and for each column decoder and selector $120c_0, \ldots, 120c_{Ns-1}$, respectively.

As it will be better described in the following, the voltage booster blocks 117, $130r_0, \ldots, 130r_{Ns-1}$ and $130c_0, \ldots, 130c_{Ns-1}$ are adapted to bootstrap the voltages at their input (typically, of the order of the supply voltage Vdd, i.e., for example, voltages in the range between 1.8 V and 3.3 V) to output voltages of the order of the voltages Vin necessary for the programming and erasing operations, and then, for example, 12 V in the case of a programming operation.

Each row decoder and selector $120r_0, \ldots, 120r_{Ns-1}$ comprises a respective block 160 for generating control signals of row driving circuits, included in a respective row driving block 170.

Figure 4:
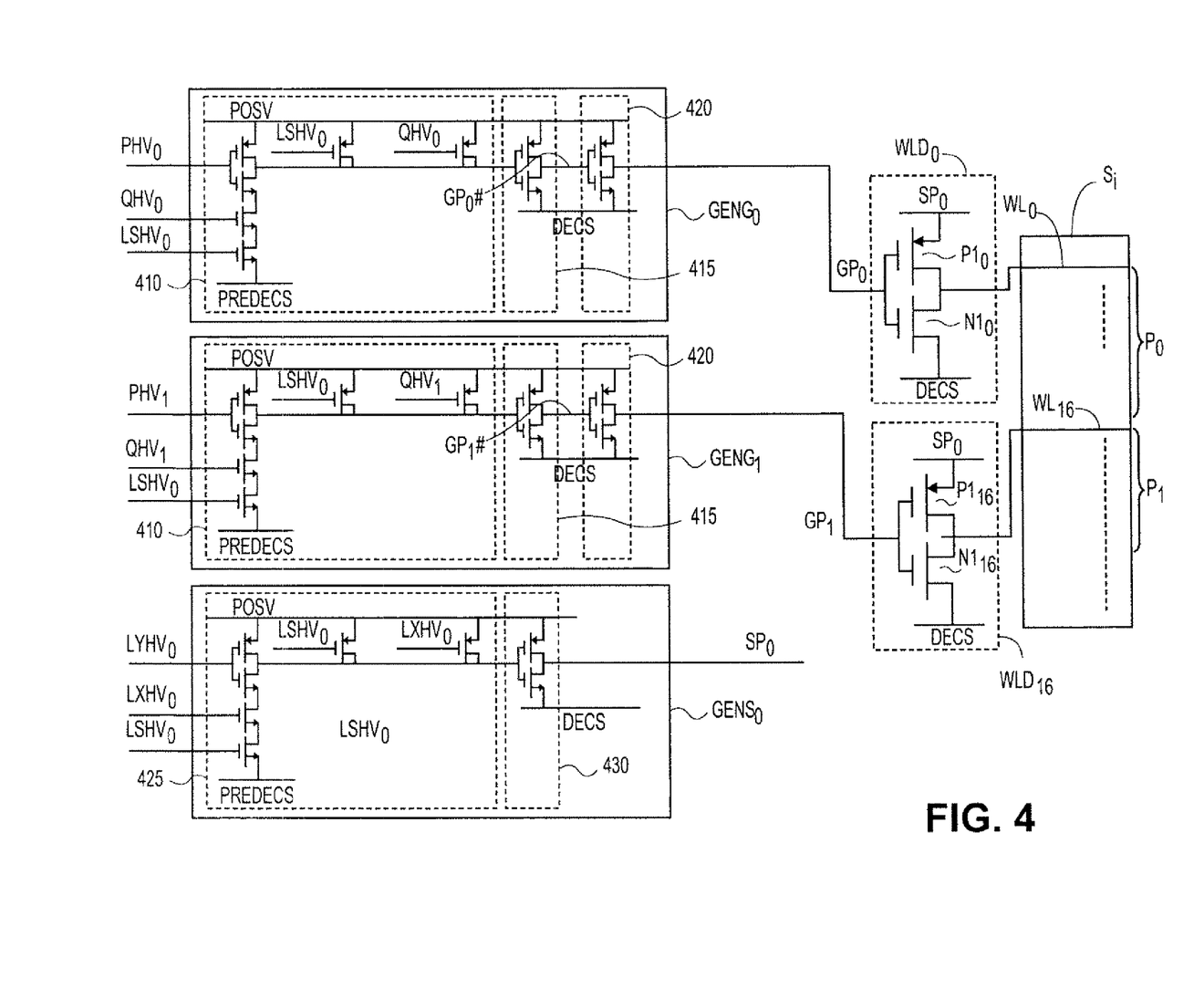
FIG. 4 shows a portion of a block for generating control signals of row driving circuits, in which the solution according to an embodiment of the present invention may be utilized.

In particular, the row driving block 170 of the generic row decoder and selector $120r_0, \ldots, 120r_{Ns-1}$ comprises a plurality of said row driving circuits $WLD_0, \ldots, WLD_{Nw1-1}$, each one including a CMOS inverter (as shown in FIG. 4, that will be described in detail in the following); the generation block 160 of the generic row decoder and selector $120r_0, \ldots, 120r_{Ns-1}$ comprises a plurality of circuits $GENG_0, \ldots, GENG_{Ngp-1}$ for generating gate signals for the MOSFETs of the CMOS inverters forming the row driving circuits $WLD_0, \ldots,$ and a plurality of supply signal generator circuits $GENS_0, \ldots, GENS_{Nsp-1}$ for said CMOS inverters (for example, as shown in FIG. 4, signals to be applied to the source terminals of the p-channel MOSFETs of the CMOS inverters).

During operation, the memory device 100 receives an address, for selecting the location, or the set of locations of the memory device, which shall undergo conventional operations, such as programming, reading and/or erasing; the address, supplied by the addressing signals ADD, is provided in input to the pre-decoding circuit 110.

The pre-decoding circuit 110 manages the switching-on, starting from the received address, of groups LSLV, LXLV, LYLV, LZLV, PLV and QLV of pre-decoding signal lines, which, for example, can assume voltage values equal to the reference voltage GND or to the supply voltage Vdd, depending on their switching on/off state.

In greater detail, the group of lines LSLV comprises a plurality of lines $LSLV_0, \ldots, LSLV_{Ns-1}$, each one corresponding to one among the sectors $S_0, \ldots, S_{Ns-1}$ and adapted to the selection of the desired sector. For this purpose, each line of the group $LSLV_0, \ldots, LSLV_{Ns-1}$ is provided in input to a corresponding sector voltage booster block $130r_0, \ldots, 130r_{Ns-1}$, which, through a corresponding sector selection line $LSHV_0, \ldots, LSHV_{Ns-1}$ shifted in voltage, provides a sector selection signal, properly shifted in voltage, of the order of the voltages Vin to the respective row decoder and selector $120r_0, \ldots, 120r_{Ns-1}$. For example, when, during a programming operation, it is desired to select the generic sector, for programming the memory cells thereof, the voltage of the corresponding line $LSHV_0, \ldots, LSHV_{Ns-1}$ assumes a relatively high value (for example, 12 V) while the remaining lines of the group LSHV are typically kept at ground.

The groups LXLV, LYLV, PLV, and QLV of signal lines comprise respective pluralities of signal lines $LXLV_0, \ldots, LXLV_{X-1}; LXLV_0, \ldots, LYLV_Y; PLV_0, \ldots, PLV_{P-1};$ and $QLV_0, \ldots, QLV_{Q-1}$ to which correspond respective pluralities of voltage-shifted signal lines $LXHV_0, \ldots, LXHV_{X-1}; LYHV_0, \ldots, LYHV_{Y-1}; PHV_0, \ldots, PHV_{P-1}$ and $QHV_0, \ldots, QHV_{Q-1}$, belonging to groups LXHV, LYHV, PHV, and QHV of voltage-shifted signal lines, respectively. In greater detail, the voltage booster block 117 receives in input the signal lines $LXLV_0, \ldots, LXLV_{X-1}; LYLV_0, \ldots, LYLV_{Y-1}; PLN_0, \ldots, PLV_{P-1};$ and $QLV_0, \ldots, QLV_{Q-1}$ provided by the pre-decoding circuit 110, and in output it drives the voltage-shifted signal lines $LXHV_0, \ldots, LXHV_{X-1}; LYHV_0, \ldots, LYHV_{Y-1}; PHV_0, \ldots, PHY_{P-1}$ and £ $QHV_0, \ldots, QHV_{Q-1}$.

In particular, the signal lines $LXHV_0, \ldots, LXHV_{X-1}; LYHV_0, \ldots, LYHV_{Y-1}; PHV_0, \ldots, PHV_{P-1}$ and $QHV_0, \ldots, QHV_{Q-1}$ are adapted to select a set of word lines (for example, a single word line at a time), to which the cells to be submitted to conventional operations inside the selected memory sector are connected. In fact, during the operation of the memory device 100, the generic row decoder and selector $120r_0, \ldots, 120r_{Ns-1}$ corresponding to the selected sector receives the signals supplied by the groups of signal lines LXHV, LYHV, PHV and QHV and, starting from the latter, it generates, by way of the generation block 160, the control signals of the row driving circuits of the driving block 170.

Under the control of the generation block 160, the row driving block 170 properly biases the word lines of the selected memory sector. In particular, the biasing voltage of a generic word line $WL_0, \ldots,$ of the selected sector is set by the corresponding driving circuit $WLD_0, \ldots, WLD_{Nw1-1}$ and it assumes a different value depending on the operation which has to be performed, and on whether the word line is selected or not. For this purpose, a number of driving circuits [is] are provided, equal to the number of word lines of the sector. For example, during a programming operation the word line $WL_0, \ldots, WL_{Nw1-1}$, to which a gate terminal of the selected cell MC is connected, receives a suitable row programming voltage from the corresponding driving circuit $WLD_0, \ldots, WLD_{Nw1-1}$, for example equal to about 12 V. The other word lines of the sector are kept at a reference voltage to inhibit the programming operation of the cells connected thereto (typically, ground). By contrast, during an erasing operation of a selected sector, all the word lines belonging to the sector receive a suitable erasing voltage, for example equal to −9 V.

Figure 2:
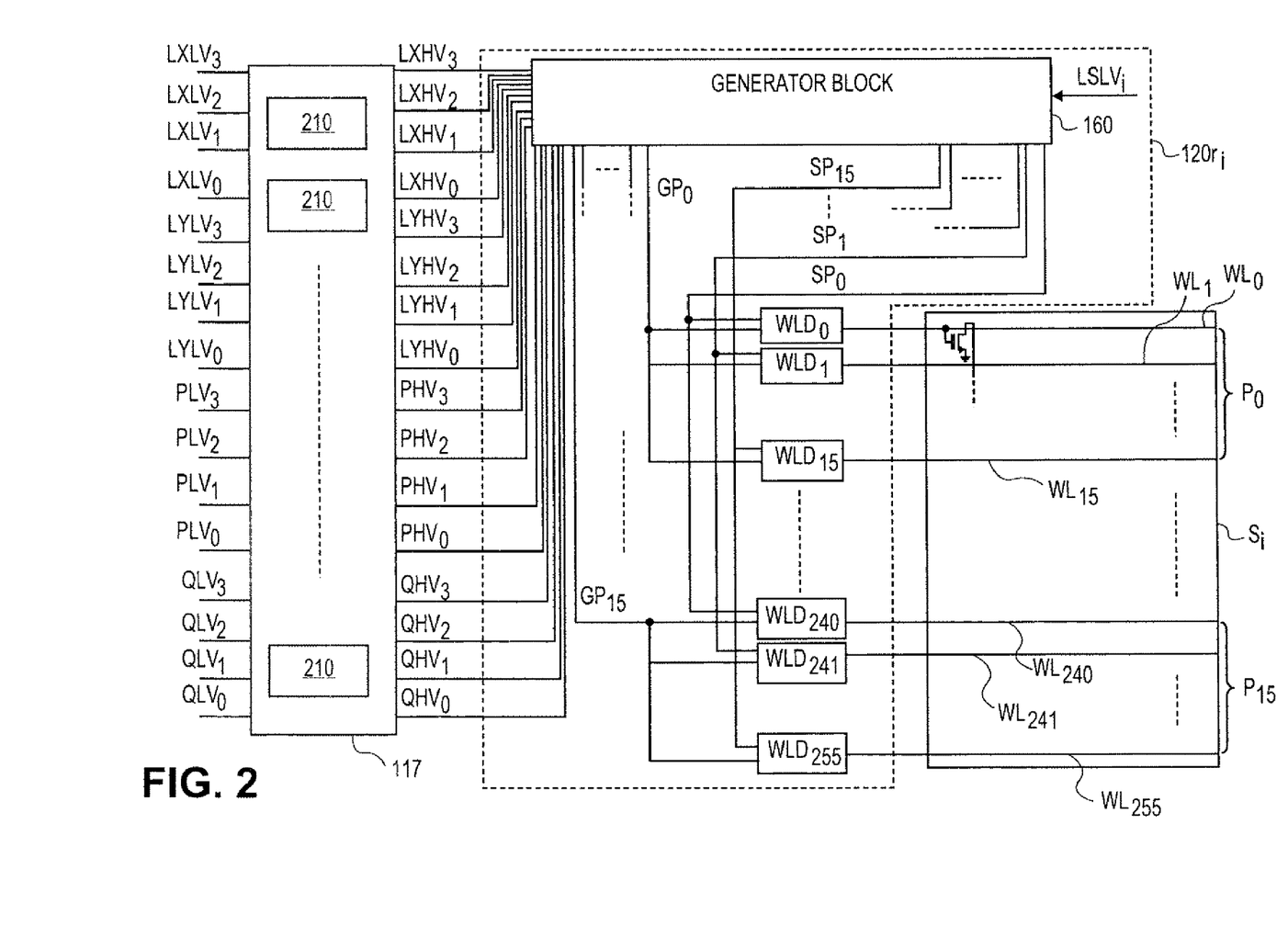
FIG. 2 shows in greater detail a portion related to a sector of the memory device shown in FIG. 1, according to an embodiment of the present invention.

For example, in the case of a memory device having 32 sectors (i.e., with Ns=32), each one including, for example, 256 word lines, the group LSHV of signal lines comprises 32 signal lines, and the groups of LXHV, LYHV, PHV and QHV of signal lines comprise (as shown in FIG. 2) the signal lines $LXHV_0, \ldots, LXHV_3, LYHV_0, \ldots, LYHV_3, PHV_0, \ldots, PHV_3$ and $QHV_0, \ldots, QHV_3$ (i.e., in the considered example it is X=4, Y=4, P=4 and Q=4), respectively. Each word line is identified by way of a suitable switching-on combination of the lines $LXHV_0, \ldots, LXHV_3, LYHV_1, LYHV_3, PHV_0, \ldots, PHV_3$, and $QHV_0, \ldots, QHV_3$.

The group of lines LZLV comprises a plurality of lines $LZLV_0, \ldots, LZLV_{Z-1}$ which are provided to a corresponding column voltage booster block $130c_0, \ldots, 130c_{Ns-1}$, which, through a corresponding group of voltage-shifted column selection lines $LZHV_0, \ldots, LZHV_{Z-1}$, provides column selection signals properly shifted in voltage and consistent with the considered voltage values in the specific operation that is performed on the memory to the related column decoder and selector $120_0, \ldots, 120_{Ns-1}$. For example, when, during a programming operation, it is desired to select the bit line of the cell to be programmed, the voltage of the corresponding line $LZHV_0, \ldots, LZHV_{Z-1}$ assumes a relatively high value (for example, 5 V), while the remaining lines of the group LZHV are typically kept at ground, or left floating.

With reference to FIG. 2, an example structural diagram of a portion of the device 100 is shown, in which the plurality of word lines $WL_0, \ldots, WL_{Nw1-1}$ of the selected sector $S_i$ (a generic sector among the above-mentioned sectors $S_0, \ldots,$ SNs-1) comprises, for example, 256 word lines $WL_0, \ldots,$ $WL_{255}$ (Nw1=256). The word lines are ideally divided into a plurality Ngp (in the example at issue, Ngp=16) of packets $P_0, \ldots, P_{15}$ each one including a number of word lines equal to Nsp (in the example at issue, Nsp=16). A corresponding driving circuit $WLD_0, \ldots, WLD_{Nw1-1}$, belonging to the row driving block 170, is associated with each generic word line $WL_0, \ldots, WL_{255}$.

In FIG. 2 the voltage booster block 117 and the generation block or row driving signal generator block 160 corresponding to the selected sector $S_i$ are also shown.

The voltage booster block 117 comprises a plurality of elemental voltage booster blocks 210. In particular, one among the elemental voltage booster blocks 210 corresponds to each signal line belonging to the groups of signal lines LXLV, LYLV, PLV and QLV.

In particular, the number (indicated by the index m) of elemental voltage booster blocks 210 included in the memory device 100 is given by: m=X+Y+P+Q in which X, Y, P, and Q represent the number of signal lines comprised in the groups of signal lines LXLV, LYLV, PLV and QLV (in the example considered in FIG. 2, m=16), respectively.

It is noted that the number of elemental voltage booster blocks 210 included in the voltage booster block 117 depends on the type of implemented row decoding, i.e., on the number of pre-decoding levels and on the number of the pre-decoding signal lines.

In the example at issue, since each group of signal lines LXLV, LYLV, PLV and QLV comprises the four signal lines $LXLV_0, \ldots, LXLV_3, LYLV_1, \ldots, LYLV_3, PLV_0, \ldots, PLV_3$, and $QLV_0, \ldots, QLV_3$, the number of elemental voltage boosters 210 is equal to 16.

During the operation of the memory device 100, for example, during a programming operation of the desired cell MC belonging to the selected sector $S_i$, the voltage booster block 117 receives the low-voltage signals (for example, depending on the switching-on state, assuming voltages equal to ground or to the supply voltage Vdd, for example 3.3 V or even 1.8 V) by means of the signal lines $LXLV_0, \ldots, LXLV_3$; $LYLV_0, \ldots, LYLV_3$; $PLV_0, \ldots, PLV_3$; $QLV_0, \ldots, QLV_{Q-1}$; and it provides as output signals shifted to a high voltage (for example, depending on the switching-on state, assuming voltages equal to ground or to 12 V) by means of the signal lines $LXHV_0, \ldots, LXHV_3$; $LYHV_i, \ldots, LYHV_3$; $PHV_0, \ldots, PHV_3$ and $QHV_0, \ldots, QHV_3$. In particular, each elemental block booster 210 receives the corresponding low-voltage signal and shifts it in voltage providing it in output from the corresponding line.

The row driving signal generator block 160 receives [in] as input the voltage-shifted signals supplied by the signal lines $LXHV_0, \ldots, LXHV_3, LYHV_0, \ldots, LYHV_3, PHV_0, \ldots,$ $PHV_3 QHV_0, \ldots, QHV_3$ and, starting from the latter, generates a plurality Ngp (in the example at issue, Ngp=16) of gate driving signals $GP_0, \ldots, GP_{15}$ for driving the MOSFETs of the CMOS inverters forming the row driving circuits $WLD_0, \ldots, WLD_{255}$, and a plurality Nsp (in the example at issue, Nsp=16) of supply signals $SP_0, \ldots, SP_{15}$ for supplying the CMOS inverters.

In particular, the number Ngp of the gate driving signals $GP_0, \ldots, GP_{15}$ and the number Nsp of the supply voltage signals $SP_0, \ldots, SP_{15}$ generated by the block for generating row driving signals 160 are such that: Nw1=Ngp*Nsp in which, as already mentioned, Nw1 indicates the number of word lines comprised in the selected sector $S_i$.

In this way, each one among the gate signals $GP_0, \ldots, GP_{15}$ corresponds to a respective word line packet $P_0, \ldots, P_{15}$ and drives all the driving circuits related to the corresponding word line packet. Furthermore, the generic voltage signal $SP_0, \ldots, SP_{15}$ supplies a driving circuit for each word line packet $P_0, \ldots, P_{15}$.

It is noted that each driving circuit $WLD_0, \ldots, WLD_{255}$ belonging to the generic packet drives the voltage of the corresponding word lines of the packet depending on the voltage level of the gate signal and of the supply signal received from the block 160.

Figure 3:
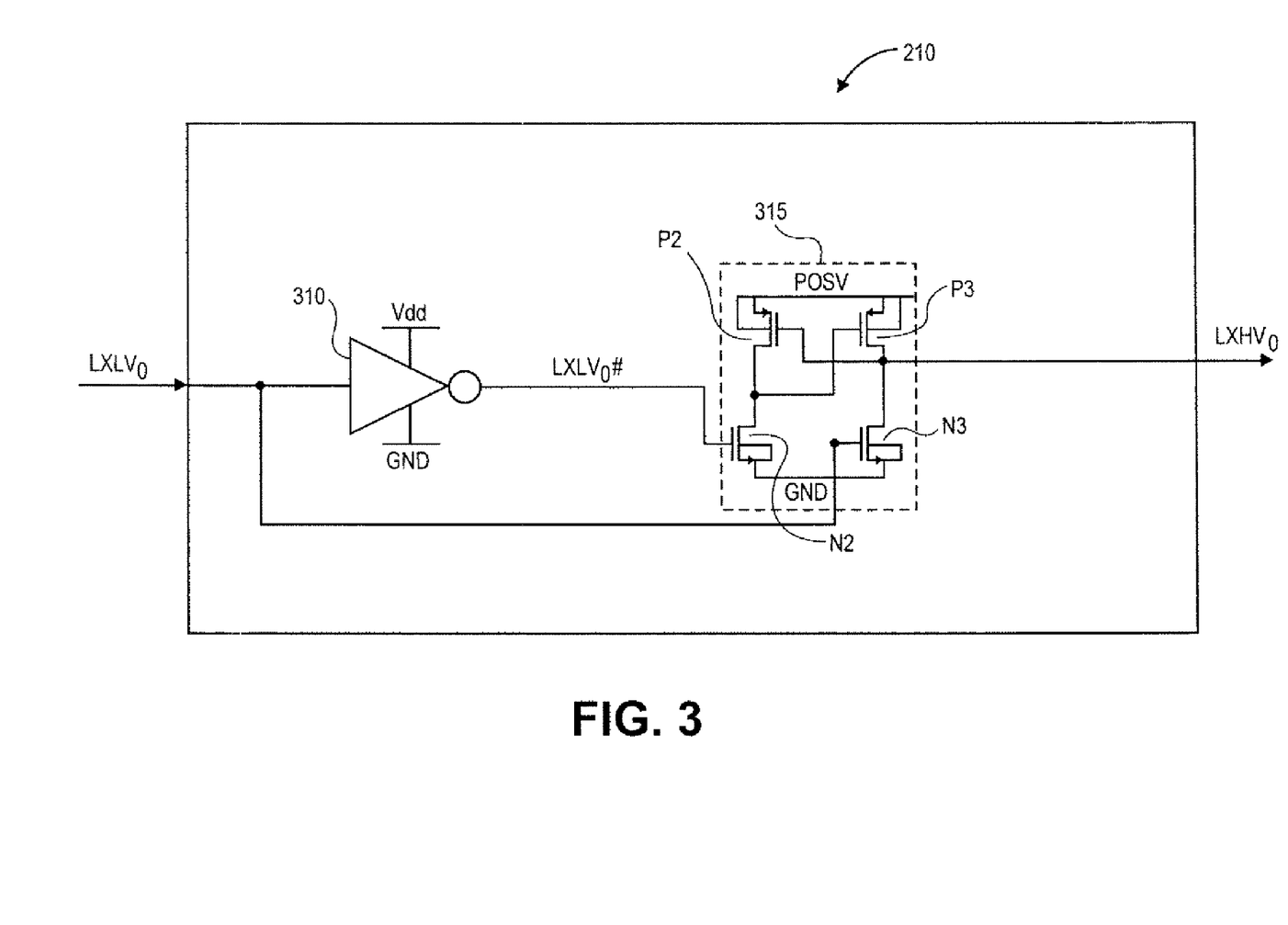
FIG. 3 shows an example implementation of a voltage booster block according to an embodiment of the present invention.

With reference to FIG. 3, a circuit scheme of the generic elemental voltage booster block 210 is shown, which in particular is adapted to boost a voltage signal supplied by a generic one among the lines of the group LXLV, for example, the line $LXLV_0$; the remaining elemental voltage booster blocks have identical structure. The elemental voltage booster block 210 comprises an inverter 310 (or equivalently an odd number of inverters), for example, of CMOS type, and a voltage-shifter block 315.

The inverter 310 has an input terminal connected to the signal line $LXLV_0$ and an output terminal connected to the shifter block 315. Furthermore, the inverter 310 is supplied by the supply voltages Vdd and GND.

The voltage-shifter block 315 has a latch structure, which comprises two p-channel MOSFET transistors P2 and P3 and two n-channel MOSFET transistors N2 and N3. The transistors P2 and P3 have the corresponding source terminals adapted to receive a biasing voltage POSV which, depending on the operation to be performed, can be equal to the supply voltage Vdd or higher, for example 12V in the case of the programming operation. The transistors N2 and N3 have the corresponding drain terminals connected to the drain terminals of the transistors P2 and P3, respectively. The gate terminal of the transistor P2 is connected to the drain terminal of the transistor P3 and the gate terminal of the transistor P3 is connected to the drain terminal of the transistor P2 that is in turn connected to an output terminal connected to the voltage-shifted signal line $LXHV_0$. The transistors N2 and N3 have the source terminals receiving the reference voltage GND. The gate terminal of the transistor N3 is connected to the input terminal of the inverter 310 and receives a low-voltage signal (for example, equal to ground or to 3.3 V or 1.8 V, depending on the switching-on state of the signal) from the signal line $LXLV_0$. The transistor N2 has the gate terminal connected to the output terminal of the inverter 310, thus receiving a signal $LXLV_{0\#}$ that is the logic complement of the signal $LXLV_0$.

Furthermore, the connections of the body terminals of all the transistors are such that [their] the correct operation of the transistors is assured in any situation, and such that the PN junctions of the transistors are not forward biased.

When the signal line $LXLV_0$ is switched on, and the logic signal it carries is asserted to the high logic value, the signal line reaches the supply voltage Vdd, for example, 3.3 V or even 1.8 V; the inverter 310 provides as an output the complementary signal $LXHV_{0\#}$ at the low logic value (i.e., in terms of voltage, at ground GND). In such conditions, the transistor N3 is kept turned on, while the transistor N2 is kept turned off. The transistor N2 is in series to the transistor P2, and, since no current can flow in the circuit branch formed by the transistors P2 and N2 (because the transistor N2 is turned off), the transistor P2, turned on because the circuit node corresponding to its gate terminal is kept at ground by the transistor N3, brings the voltage of its drain terminal at the biasing voltage POSV. In such conditions, also the transistor P3 is turned off, and then the transistor N3 can actually keep its drain terminal (and then the voltage of the signal $LXHV_0$) at ground GND.

On the other hand, when the signal line $LXLV_0$ is not switched on, that is, it is at the low logic value (i.e., in terms of voltage, at ground GND), the drain voltage of the transistor P3 and, then, the signal line $LXHV_0$ reaches the voltage POSV.

In this way, the elemental block booster 210 shifts the low input voltage on the signal line $LXLV_0$ to higher output voltage levels, which are adapted to correctly drive the CMOS inverter of the corresponding driving circuit by means of the shifted signal line $LXHV_0$.

The voltage-shifter block 315 occupies a relatively wide integrated circuit area. In fact, while the transistors N2 and N3 are driven by the voltages provided by the signal lines $LXLV_0$ and $LXLV_0\#$, respectively, which are relatively low (i.e., of the order of the supply voltages Vdd), the transistors P2 and P3 are driven by the biasing voltage POSV that, in the case, for example, a programming operation is being performed, is of the order of the voltages Vin (for example, 12 V). Then, the driving voltage of the transistors P2 and P3 is quite a bit higher than the driving voltage of the transistors N2 and N3. In order for the latch structure to be correctly moved towards the desired direction, so that the voltages at the drain terminals of the transistors P2 and P3 can be brought to the desired values (i.e., to POSV and GND), the n-channel transistors N2 and N3 need to be sized in such a way that the greater driving capability of the p-channel transistors P2 and P3, due to the greater driving voltage across P2 and P3 can be opposed with a complementary opposing voltage.

The solution of the present invention according to the embodiment just described greatly reduces the area occupied by the level shifters inside the semiconductor material chip, where the memory device is integrated.

In fact, the structure of the row and column decoding and selection circuit, according to the solution of the present invention, provides, for all the sectors $S_0, \ldots, S_{Ns-1}$ (or at least for groups of two or more sectors), a single group of level shifter blocks, shared by the various sectors. This permits a significant reduction in terms of area of the device, thanks to the plurality of elemental voltage booster blocks 210 common to all the sectors (or to groups of sectors), and the generated signals are used from time to time by the selected sector Si. On the contrary, a solution, in which each row decoder and selector $120r_0, \ldots, 120r_{Ns-1}$ receives the signals $LXLV_0, \ldots, LXLV_{X-1}$; $LYLV_0, \ldots, LYLV_{Y-1}$; $PLV_0, \ldots, PLV_{P-1}$; and $QLV_0, \ldots, QLV_{Q-1}$ and includes a respective voltage booster for shifting in voltage such pre-decoding signals, could require a substantial increase of the area of the device.

In particular, with respect to this last case, according to embodiments of the present invention, it is possible to obtain a significant reduction, up to one third, of the area occupied by the decoding and selection circuit inside the semiconductor material chip.

With reference to FIG. 4, in connection with the exemplifying scheme of FIG. 2, two generic gate voltage generators, in the example at issue $GENG_0$ and $GENG_1$, and a generic supply voltage generator $GENS_0$ are shown, properly connected to the corresponding driving circuits $WLD_0$ and $WLD_{16}$, in the example connected to the word lines $WL_0$ and $WL_{16}$ of two adjacent word line packets $P_0$ and $P_t$.

Both the driving circuits $WLD_0$ and $WLD_{16}$ receive the supply voltage from the supply signal $SP_0$ and the gate voltages from the gate driving signals $GP_0$ and $GP_1$ provided by the supply voltage generator $GENS_0$ and by the two gate voltage generators $GENG_0$ and $GENG_1$, respectively.

In particular, the gate voltage generator circuit $GENG_0$ comprises a NAND logic gate 410 having three input terminals and an output terminal connected to an input of a first inverter 415, with a second inverter 420 in cascade there to whose output constitutes the driving gate signal $GP_0$. The output terminal of the first inverter 415 makes available a complementary driving gate signal $GP_{0\#}$.

The three input terminals of the NAND gate 410 of the generic gate voltage generator circuit are connected to corresponding signal lines belonging to the groups of lines PHV, LSHV and QHV. For example, the NAND gate 410 of the gate voltage generator $GENG_0$ receives in input the signal lines $PHV_0$, $QHV_0$ and $LSHV_0$, while the gate voltage generator $GENG_1$ receives in input the signal lines $PHV_1$, $QHV_1$ and $LSHV_0$.

The NAND gate 410 and the two inverters 415 and 420 are supplied by three biasing voltages POSV, PREDECS and DECS, which are supplied by three supply voltage lines, respectively, indicated in the following description by the same reference numeral. The biasing voltages POSV, PREDECS and DECS vary depending on the operations to be performed on the memory cells; for example, in the programming operation the voltage POSV assumes a relatively high value, for example 12V, while the voltages PREDECS and DECS are kept at ground. In the erasing operation, on the other hand, the voltages DECS and POSV assume relatively low values (for example, equal to −9 V and 0 V, respectively), while the voltage PREDECS remains at ground. The output of the inverter 420 of the gate voltage generator circuit $GENG_0$ constitutes the gate signal $GP_0$ that is provided to the corresponding driving circuit $WLD_0$. The gate voltage generator circuit $GENG_1$ has a structure analogous to that of the gate voltage generator circuit $GENG_0$.

The supply voltage generator circuit $GENS_0$ comprises a NAND logic gate 425 and, in cascade thereto, an inverter 430. The NAND logic gate 425 has three input terminals, each one connected to corresponding signal lines $LXHV_0$, $LXHV_0$ and $LSHV_0$. The NAND gate 425 and the inverter 430 are supplied by the biasing voltages POSV, PREDECS and DECS. The output of the inverter 430 constitutes the supply voltage signal $SP_0$, which is provided to the corresponding driving circuits $WLD_0$ and $WLD_{16}$.

In the example shown in FIG. 4, the NAND logic gates and the inverters are of CMOS type; however, this is not to be intended as a limitation of the present invention, and other logic families could be used.

The row driving circuits $WLD_0$ and $WLD_{16}$ (and in general each driving circuit $WLD_0, \ldots, WLD_{255}$) comprise a voltage pull-up p-channel MOSFET transistor $P1_0$ and $P1_{16}$, respectively, connected in series to a voltage pull-down n-channel MOSFET transistor $N1_0$ and $N1_{16}$, respectively, so as to faun a CMOS inverter, supplied by the biasing voltage DECS and by the supply signal $SP_0$, which assume different values depending on the operation to be performed. For example, during the programming operation the biasing voltage DECS assumes a value equal to the reference voltage GND (i.e., ground) and the supply voltage of the inverter $SP_0$ is equal to a programming voltage (i.e., equal to about 12 V), while during an erasing operation the biasing voltage DECS assumes a low value (for example −9 V) and the supply signal $SP_0$ is typically kept at ground.

Both the transistors $N1_0$ and $P1_0$ have the gate terminal receiving the driving voltage supplied by the driving gate signal $GP_0$ provided by the corresponding gate voltage generator circuit and the drain terminals connected to the corresponding word line (i.e., $WL_0$). Similarly, the driving circuit $WLD_{16}$ has the transistors $N1_{16}$ and $P1_{16}$ that have the gate terminal receiving the driving voltage supplied by the driving signal $GP_1$ provided by the corresponding gate voltage generator circuit and the drain terminals connected to the word line $WL_{16}$.

During the programming operation for a selected cell, the word line corresponding to the cell (in the example at issue, the word line $WL_0$) is supplied at a programming voltage (for example, equal to about 12 V). The remaining word lines (for example, the word line $WL_{16}$) of the sector are kept at the reference voltage GND.

For this purpose the signal lines $LSHV_0$, $LXHV_0$, $LYHV_0$, $PHV_0$, and $QHV_0$ are switched on at the high logic level (i.e., supplied at a biasing voltage POSV). In such a condition, the driving gate signal $GP_0$ is at the low logic level, corresponding to a voltage supplied by the line DECS (in the example at issue the reference voltage GND), and the supply signal $SP_0$ is at the high logic level, corresponding to a biasing voltage POSV that, in the case of the programming operation, is equal to a programming voltage and then, for example, equal to about 12 V. Thanks to this, the pull-up transistor $P1_0$ of the driving circuit $WLD_0$ brings its drain terminal and, then, the word line $WL_0$ to a programming voltage (for example equal to about 12 V).

Simultaneously, the signal lines $PHV_1$ and $QHV_i$ are kept at the low logic level, corresponding to a voltage GND, thus bringing the driving gate signal $GP_1$ to the high logic level (corresponding to a programming voltage supplied by the supply voltage line POSV). In such conditions, the pull-down transistor $N1_{16}$ of the driving circuit $WLD_{16}$ brings its drain terminal and, then, the word line $WL_{16}$ to the reference voltage GND (typically, ground). In this way, the word lines are biased at the voltages correct for the programming operation (in turn, the column decoder properly biases the bit lines).

Naturally, in order to satisfy contingent and specific requirements, a person skilled in the art may apply many modifications and alterations to the above-described solution. In particular, although the present invention has been described with a certain degree of details with reference to preferred embodiments thereof, it is apparent that various omissions, substitutions and changes in the form and in the details, as well as other embodiments, are possible.

For example, analogous considerations apply if the memory device has a different structure, or if it includes equivalent elements (for example, with multilevel memory cells).

Furthermore, although described with reference to a non-volatile electrically programmable memory device, and more particularly a flash memory, nothing prevents one from applying the solution of the invention in other memory devices, also not programmable, for example, in order to boost (with respect to the supply voltage of the memory device) the voltages applied to the word lines during a reading operation.

Furthermore, the number of memory sectors and/or the size of the memory sectors can be different.

Moreover, also the number of word lines included in each sector can vary.

Furthermore, although in the preceding description reference has been made to a row decoder and selector, nothing prevents one from applying the solution of the invention also to a column decoder and selector. In particular, a single column voltage booster common to all the sectors could be provided, or, at least, to two or more sectors.

Moreover, it is possible that a general variation of the proposed solution is applicable to the managing of negative signals during the erasing operations on the memory device.

Furthermore, as yet mentioned, instead of having a single voltage booster circuit for all the memory sectors, it is possible to have two or more booster circuits, each one associated with two or more respective memory sectors.

The invention claimed is:

1. A memory device comprising:
    a plurality of memory cells, said memory cells being grouped in at least two memory sectors,
    a plurality of memory cell address signal lines respectively coupled to the memory cells;
    a first decoding circuit coupled to an address bus to receive address codes of the memory cells from the address bus and, in response thereto, to assert a plurality of decoding and selecting signals common to said at least two memory sectors;
    a plurality of second decoding circuits respectively coupled to said at least two memory sectors, each second decoding circuit also being coupled to the first decoding circuit to receive said plurality of decoding and selecting signals and to generate driving signals for driving said memory cell address signal lines depending on said decoding and selecting signals; and
    a plurality of voltage boosting blocks coupled to said first decoding circuit and to said plurality of second decoding circuits for receiving said plurality of decoding and selecting signals and shifting the plurality of decoding and selecting signals in voltage to a shifted-voltage level to generate respective shifted decoding and selecting signals common to the at least two memory sectors, and to provide the shifted decoding and selecting signals to the plurality of second decoding circuits to generate the driving signals.

2. The memory device according to claim 1, wherein each one of the second decoding circuits comprises:
a plurality of driving circuits to generate said driving signals for driving said memory cell address signal lines, each driving circuit being coupled to at least one corresponding memory cell address signal line of a respective one of the at least two memory sectors;
a plurality of control signal generator blocks to generate control signals for said driving circuits in response to at least one first subset of said shifted decoding and selecting signals; and
a plurality of supply voltage signal generator circuits to generate supply voltage signals for said driving circuits in response to at least one second subset of said shifted decoding and selecting signals, said supply voltage signals forming supply voltages.

3. The memory device according to claim 2, wherein each one of the at least two memory sectors comprises at least one packet of the memory cell address signal lines wherein each of the supply voltage signal generator circuits is coupled to a corresponding one of the memory cell address signal lines of the at least one packet, and the at least one packet of said memory cell address signal lines is coupled to a corresponding one of the plurality of control signal generator blocks.

4. The memory device according to claim 1, wherein said first decoding circuit asserts at least two sector selection signals, each one corresponding to a respective memory sector of the at least two memory sectors in response to the address codes, and wherein said voltage boosting blocks further include sector voltage boosting blocks to generate shifted sector selection signals, said shifted sector selection signals being provided to the plurality of second decoding circuits in combination with said shifted decoding and selecting signals common to the at least two memory sectors.

5. The memory device according to claim 4, further comprising a plurality of control signal generator blocks, wherein each control signal generator block includes a first NAND logic gate, said first NAND logic gate being connected to an even number of first inverter logic circuits to provide a corresponding control signal in response to a first combination of said shifted decoding and selecting signals with the corresponding shifted sector selection signal.

6. The memory device according to claim 4, wherein each of a plurality of supply voltage signal generator circuits includes a second NAND logic gate and a second inverter logic circuit, said second NAND logic gate being to provide a corresponding supply voltage signal in response to a second combination of said shifted decoding and selecting signals with the corresponding shifted sector selection signal.

7. The memory device according to claim 1, wherein said voltage boosting blocks include:
a voltage-shifter block having a first and a second transistor of a first conductivity type, and a third and a fourth transistor of a second conductivity type connected according to a latch structure, wherein the third and the fourth transistors are structured to receive a biasing voltage having a value corresponding to the shifted voltage level; and
inverter connected to the voltage-shifter block.

8. The memory device according to claim 7, wherein said voltage boosting blocks include one of a plurality of voltage-shifter blocks for each of the shifted decoding and selecting signal common to the at least two memory sectors.

9. The memory device according to claim 1, wherein said memory cells are electrically programmable, and said driving signals are adapted to bias the memory cell address signal lines to a voltage suitable to allow for programming of the cells.

10. The memory device according to claim 1, wherein said memory cells include flash memory cells.

11. A method of operation of a memory device, comprising the steps of:
grouping a plurality of memory cells in at least two memory sectors;
associating with each of the memory cells a respective one of a plurality of memory cell address signal lines;
receiving an address code;
performing a first decoding of the address code of the memory cells and, in response thereto, asserting a plurality of decoding and selecting signals common to said at least two memory sectors; and
performing a second decoding, for each one of the at least two memory sectors, for generating driving signals for said memory cell address signal lines depending on said decoding and selecting signals; shifting a voltage of said decoding and selecting signals for generating respective shifted decoding and selecting signals common to the at least two memory sectors; and
generating the driving signals using the shifted decoding and selecting signals.

12. The method of claim 11 wherein performing the first decoding, further includes:
generating at least two sector selection signals in response to receiving the address code wherein each of the at least two sector selection signals corresponds to a respective one of the at least two memory sectors.

13. The method of claim 12, further includes: generating shifted sector selection signals by voltage shifting the at least two sector selection signals.

14. The method of claim 13 wherein performing the second decoding, further includes:
generating control signals for a plurality of driving circuits in response to at least one first subset of the shifted decoding and selecting signals; and generating supply voltage signals for the plurality of driving circuits in response to at least one second subset of the shifted decoding and selecting signals wherein the supply voltage signals form supply voltages.

15. The method of claim 14 wherein generating the control signals, further includes:
communicatively coupling a first NAND logic gate to an even number of first inverter logic circuits and providing a corresponding one of the control signals in response to a first combination of the shifted decoding and selecting signals with a corresponding one of the shifted sector selection signals.

16. The method of claim 15 wherein generating the supply voltage signals, further includes:
communicatively coupling a second NAND logic gate to a second inverter logic circuit and providing a corresponding one of the supply voltage signals in response to a second combination of the shifted decoding and selecting signals with the corresponding one of the shifted sector selection signals.

17. A memory device comprising:
a plurality of memory cells grouped in at least two memory sectors wherein each of the at least two memory sectors have a memory cell arrangement allowing access to each memory cell via respective memory cell address signal lines;

a first decoding circuit coupled to an address bus to receive address codes of the plurality of memory cells from the address bus and to generate a plurality of decoding and selecting signals in response to the address codes;

a plurality of second decoding circuits coupled to the first decoding circuit to receive said plurality of decoding and selecting signals and to generate driving signals for the memory cell address signal lines based at least in part on the plurality of decoding and selecting signals; and a voltage boosting block coupled to said first decoding circuit and to said plurality of second decoding circuits to receive said plurality of decoding and selecting signals and to generate a shift in voltage of the plurality of decoding and selecting signals and provide shifted decoding and selecting signals to the plurality of second decoding circuits for generating the drive signals.

18. The memory device of claim 17 wherein said first decoding circuit generates at least two sector selection signals in response to the address codes, wherein each of the at least two sector selection signals corresponds to a respective one of the at least two memory sectors.

19. The memory device of claim 18 wherein the voltage boosting blocks further shift a voltage of the at least two sector selection signals to generate shifted sector selection signals, the shifted sector selection signals being provided to the plurality of second decoding circuits in combination with the shifted decoding and selecting signals.

20. The memory device of claim 19 wherein each of the plurality of second decoding circuits, further comprises:

a plurality of driving circuits to generate the driving signals for the memory cell address signal lines;

a plurality of control signal generator blocks to generate control signals for the plurality of driving circuits in response to at least one of the shifted decoding and selecting signals; and a plurality of supply voltage signal generator circuits to generate supply voltage signals for the plurality of driving circuits in response to at least one of the shifted decoding and selecting signals.

* * * * *

UNITED STATES PATENT AND TRADEMARK OFFICE
CERTIFICATE OF CORRECTION

| | | |
|---|---|---|
| PATENT NO. | : 7,965,561 B2 | Page 1 of 1 |
| APPLICATION NO. | : 11/672857 | |
| DATED | : June 21, 2011 | |
| INVENTOR(S) | : Pierguido Garofalo et al. | |

It is certified that error appears in the above-identified patent and that said Letters Patent is hereby corrected as shown below:

In column 11, line 65, in Claim 7, before "inverter" insert -- an --.

Signed and Sealed this
Ninth Day of August, 2011

David J. Kappos
*Director of the United States Patent and Trademark Office*